United States Patent
Dierschke et al.

(10) Patent No.: US 9,683,889 B2
(45) Date of Patent: Jun. 20, 2017

(54) ULTRAVIOLET SEMICONDUCTOR SENSOR DEVICE AND METHOD OF MEASURING ULTRAVIOLET RADIATION

(71) Applicant: ams AG, Unterpremstaetten (AT)

(72) Inventors: Eugene G. Dierschke, Dallas, TX (US); Todd Bishop, Lassnitzhoehe (AT); Mario Manninger, Unterpremstaetten (AT)

(73) Assignee: AMS AG, Unterpremstaetten (AT)

( * ) Notice: Subject to any disclaimer, the term of this patent is extended or adjusted under 35 U.S.C. 154(b) by 0 days.

(21) Appl. No.: 14/773,737

(22) PCT Filed: Mar. 7, 2014

(86) PCT No.: PCT/EP2014/054475
§ 371 (c)(1),
(2) Date: Sep. 8, 2015

(87) PCT Pub. No.: WO2014/135688
PCT Pub. Date: Sep. 12, 2014

(65) Prior Publication Data
US 2016/0025558 A1    Jan. 28, 2016

Related U.S. Application Data

(60) Provisional application No. 61/774,762, filed on Mar. 8, 2013.

(30) Foreign Application Priority Data

Apr. 8, 2013  (EP) ..................... 13162745

(51) Int. Cl.
*G01J 1/42* (2006.01)
*G01J 1/04* (2006.01)
(Continued)

(52) U.S. Cl.
CPC ............. *G01J 1/429* (2013.01); *G01J 1/0437* (2013.01); *G01J 1/4228* (2013.01);
(Continued)

(58) Field of Classification Search
CPC ... G01J 1/429; G01J 1/4228; G01J 2001/1657
See application file for complete search history.

(56) References Cited

U.S. PATENT DOCUMENTS 8,084,728 B2   12/2011  Tsang
2006/0038249 A1  2/2006  Koyama
(Continued)

FOREIGN PATENT DOCUMENTS

CN    102494764 A    6/2012
EP    0392442 A1    10/1990

OTHER PUBLICATIONS

"High efficiency of solar cells and its effect on cost reduction", Advances in solar energy technology. vol. 1, Oxford: Pergamon Press, 1988, pp. 119-123 to Knobloch et al.*

*Primary Examiner* — David J Makiya
*Assistant Examiner* — Kenneth J Malkowski
(74) *Attorney, Agent, or Firm* — McDermott Will & Emery LLP (57) ABSTRACT

A photodiode (2) and a further photodiode (3) are arranged in a substrate (1) at or near a main surface (10). The photodiodes are formed and arranged in such a manner that in case of incident ultraviolet radiation (26) the electric signal from the photodiode (2) is larger than the further electric signal from the further photodiode (3). In particular, the first photodiode may be more sensitive to ultraviolet radiation than the further photodiode. The electric signal from the photodiode is attenuated by the further electric signal and thus yields an electric signal primarily measuring the incident ultraviolet radiation. The attenuation of the (Continued)

electric signal from the first photodiode may be achieved internally using an integrated circuit (25) or externally using a separate device.

16 Claims, 9 Drawing Sheets

(51) Int. Cl.
*H01L 31/0232* (2014.01)
*H01L 31/09* (2006.01)

(52) U.S. Cl.
CPC ........ *H01L 31/02327* (2013.01); *H01L 31/09* (2013.01); *H01L 2224/02372* (2013.01); *H01L 2224/0401* (2013.01); *H01L 2224/05548* (2013.01); *H01L 2224/13024* (2013.01)

(56) References Cited

U.S. PATENT DOCUMENTS

| | | |
|---|---|---|
| 2009/0184254 A1 | 7/2009 | Miura |
| 2010/0032569 A1* | 2/2010 | Kita .................. G01J 1/4228 250/338.4 |
| 2010/0123254 A1 | 5/2010 | Kraft et al. |
| 2010/0259570 A1* | 10/2010 | Omi ........................ G01J 1/02 345/690 |
| 2010/0314762 A1 | 12/2010 | Schrank et al. |
| 2011/0260284 A1 | 10/2011 | Schrank et al. |
| 2012/0199826 A1* | 8/2012 | Nakahara .............. G01J 1/1626 257/43 |
| 2012/0286430 A1 | 11/2012 | Kraft et al. |

\* cited by examiner

Fig. 12

ULTRAVIOLET SEMICONDUCTOR SENSOR DEVICE AND METHOD OF MEASURING ULTRAVIOLET RADIATION

BACKGROUND OF THE INVENTION

Silicon photodiodes can be used to detect UV (ultraviolet) radiation having a wavelength in the range from 200 nm to 400 nm. Absorption in plastic or glass used for conventional optical packages prevents the full range of ultraviolet light from reaching the photodiode inside the package.

US 2006/0038249 A1 discloses a UV sensor apparatus comprising a cathode layer and anode layers formed at a surface of the cathode layer. A section of the cathode layer that is located between the pn-junctions formed by the cathode layer with two of the anode layers is provided as light-receiving region.

U.S. Pat. No. 8,084,728 B2 discloses an optical sensing device with multiple photodiode elements and a multi-cavity Fabry-Perot ambient light filter structure. The device provides a blocking of infrared light for wavelengths in the range from 700 nm to 1100 nm.

US 2009/0184254 A1 discloses an ultraviolet sensor comprising a pair of photodiodes, in which $p^+$-type and $n^+$-type layers formed in silicon are separated by a thin layer of low doping concentration. A filter film comprising silicon nitride is formed above one of the photodiodes to transmit radiation having at least a first UV wavelength. A sealing layer which covers the other photodiode and the filter film transmits radiation having at least a different second UV wavelength.

Electrically conductive interconnects leading through the semiconductor body of a semiconductor device are known as through-wafer vias or through-substrate vias. Semiconductor devices comprising through-wafer vias or through-substrate vias are disclosed in US 2010/0123254 A1, US 2010/0314762 A1, US 2011/0260284 A1 and US 2012/0286430 A1.

SUMMARY OF THE INVENTION

The semiconductor sensor device comprises a semiconductor substrate having a main surface. A photodiode and a further photodiode are arranged in the substrate at or near the main surface. The photodiode generates an electric signal in response to incident radiation, and the further photodiode generates a further electric signal in response to the incident radiation. The photodiode and the further photodiode are formed and arranged in such a manner that in case of incident ultraviolet radiation the electric signal from the photodiode is larger than the further electric signal from the further photodiode. In particular, the first photodiode may be more sensitive to ultraviolet radiation than the further photodiode. The electric signal from the photodiode is attenuated by the further electric signal and thus yields an electric signal primarily measuring the incident ultraviolet radiation. The measurement thus comprises an electric signal generated by the first photodiode in response to the incident radiation and an attenuation of the electric signal by a further electric signal simultaneously generated by the further photodiode. The electric signal from the photodiode and the further electric signal from the further photodiode may be processed in this way internally on the sensor device by an integrated circuit, for example, or the attenuation of the electric signal by the further electric signal may be performed externally by bringing out the two electric signals separately and processing the electric signals by an external device. In particular, the photodiode and the further photodiode may be coupled in such a manner that the electric signal from the photodiode is attenuated by the further electric signal and thus yields the electric signal primarily measuring the incident ultraviolet radiation.

In an embodiment of the semiconductor sensor device the attenuation comprises a subtraction of the further electric signal generated by the further photodiode from the electric signal generated by the photodiode.

In a further embodiment an integrated circuit is arranged in the substrate and is provided to attenuate the electric signal generated by the photodiode by the further electric signal generated by the further photodiode.

A further embodiment further comprises a filter layer that reduces or inhibits a transmission of the incident ultraviolet radiation to the further photodiode without reducing or inhibiting a transmission of the incident ultraviolet radiation to the photodiode. The filter layer may be silicon nitride or polysilicon, for instance.

A further embodiment further comprises doped wells of a first type of electric conductivity formed in the substrate at or near the main surface, and pn-junctions arranged in or at the doped wells, the pn-junctions forming the photodiode and the further photodiode.

In a further embodiment the substrate is doped for a second type of electric conductivity opposite to the first type of electric conductivity, and a net doping of the first type of electric conductivity is present in the doped wells and forms the pn-junctions.

In a further embodiment the substrate is provided with an epitaxial layer doped for a second type of electric conductivity opposite to the first type of electric conductivity. The epitaxial layer forms the main surface, and the doped wells are arranged within the epitaxial layer. A net doping of the first type of electric conductivity is present in the doped wells and forms the pn-junctions.

A further embodiment further comprises doped regions of a second type of electric conductivity opposite to the first type of electric conductivity arranged within the doped wells. The pn-junctions are formed at a boundary between the doped wells and the doped regions.

In a further embodiment the doped region of the further photodiode comprises a doping concentration that increases towards the main surface, thus forming a surface dead layer of reduced diffusion lengths of charge carriers. The method of measuring ultraviolet radiation uses a photodiode and a further photodiode to generate an electric signal from the photodiode and a further electric signal from the further photodiode simultaneously in response to incident radiation. The photodiode and the further photodiode are provided in such a manner that in case of incident ultraviolet radiation the electric signal from the photodiode is larger than the further electric signal from the further photodiode. The electric signal from the photodiode is attenuated by the further electric signal in order to produce an electric signal primarily measuring the incident ultraviolet radiation.

In a variant of the method, the electric signal from the photodiode is attenuated by subtracting the further electric signal.

In a further variant of the method, a filter layer is applied that reduces or inhibits the transmission of incident ultraviolet radiation to the further photodiode without reducing or inhibiting the transmission of incident ultraviolet radiation to the photodiode.

In a further variant of the method a filter layer is applied that reduces or inhibits the transmission of incident non-ultraviolet radiation to the photodiode and to the further photodiode.

The following is a detailed description of examples of the semiconductor sensor device and of the method of measuring ultraviolet radiation.

DETAILED DESCRIPTION

Figure 1:
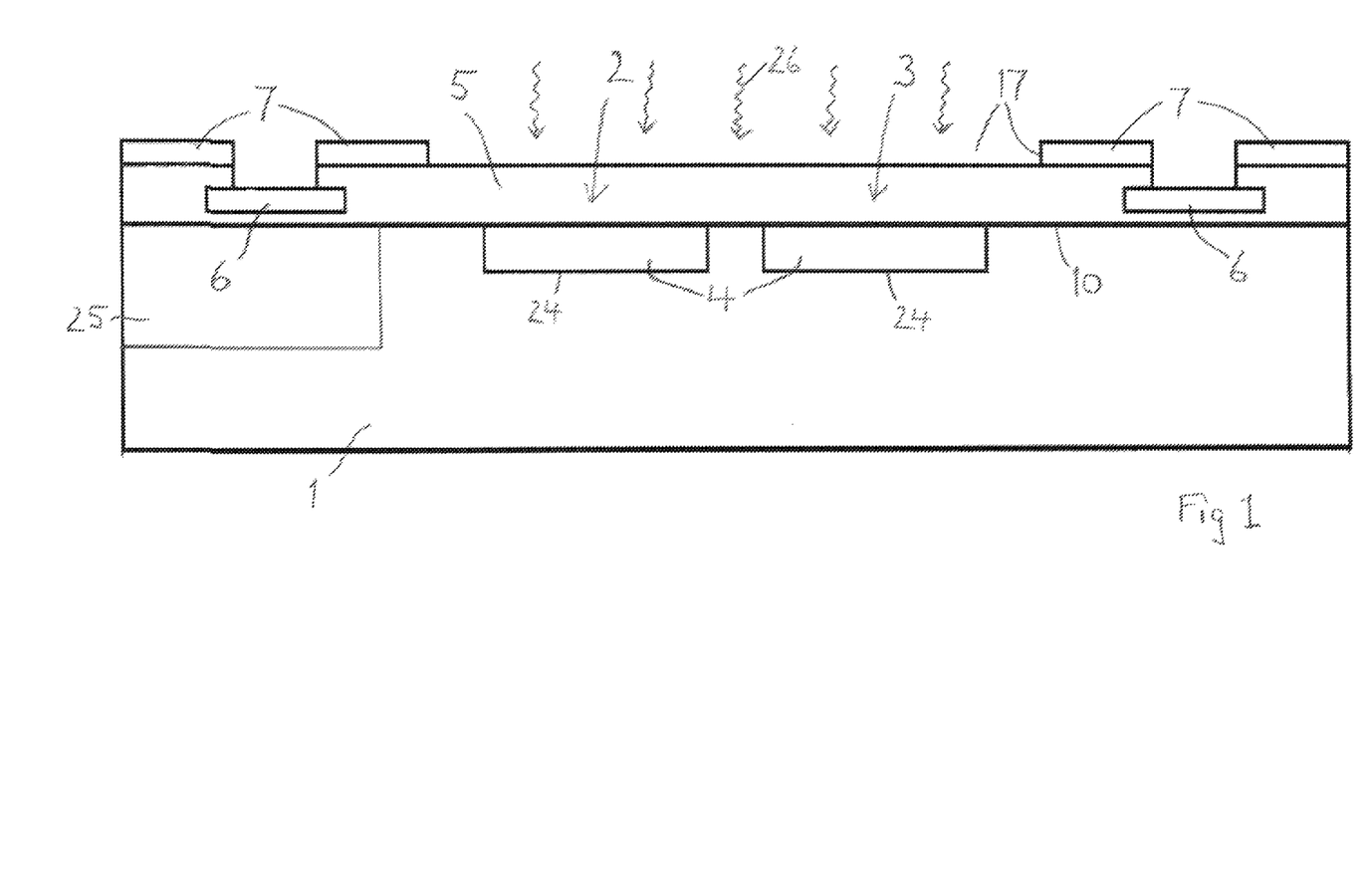
FIG. 1 is a schematic cross section of a semiconductor sensor device with integrated photodiodes.

FIG. 1 is a schematic cross section of a semiconductor sensor device comprising a semiconductor substrate 1 having two integrated photodiodes 2, 3. In order to facilitate the reference to the photodiodes, the photodiode 2 and the further photodiode 3 will in the following be designated as channel-A-photodiode 2 and channel-B-photodiode 3, respectively. The determiners "channel-A" and "channel-B" do not characterize the structure or physical properties of the photodiodes but merely indicate that the photodiodes are provided to yield different electric signals, one being transmitted as a channel-A signal and the other one being transmitted as a channel-B signal.

The photodiodes 2, 3 are provided with different responsivities or different sensitivities to incident electromagnetic radiation 26. The channel-A-photodiode 2 responds to ultraviolet radiation and may also respond to electromagnetic radiation of other wavelengths like visible or infrared light. The channel-B-photodiode 3 responds primarily to electromagnetic radiation of wavelengths outside the range of ultraviolet radiation. The different responsivities or sensitivities yield different electric signals generated by the photodiodes 2, 3 in response to incident ultraviolet radiation, the electric signal from the channel-A-photodiode 2 being larger than the electric signal from the channel-B-photodiode 3. The electric signals generated in response to other wavelenghts are optionally the same or at least essentially equal for both photodiodes 2, 3.

The incident ultraviolet radiation that is to be detected can be calculated as the difference $\Delta = ch_A - ch_B$ between the electric signal $ch_A$ generated by the channel-A-photodiode 2 and the electric signal $ch_B$ generated by the channel-B-photodiode 3. In order to account for non-ideal response of the two photodiodes 2, 3, the calculation may be improved by inserting a correcting factor K rendering a slightly modified difference $\Delta_m = ch_A - K \cdot ch_B$ between the electric signals. The factor K is typically approximately unity and may especially be kept constant for all calculations, for example. In any case the electric signal from the channel-A-photodiode 2 is attenuated by the electric signal from the channel-B-photodiode 3. In this way the signal components that derive from wavelengths lying outside the range of ultraviolet radiation are at least partially eliminated, while the signal components deriving from ultraviolet radiation are retained. In view of its function this device may be referred to as a "differential dual photodiode ultraviolet sensor." The calculation may be performed by an integrated circuit, for example, or by means of an external device receiving the signals from the photodiodes.

The photodiodes 2, 3 may be integrated using doped wells 4 of a first type of electric conductivity formed in the substrate 1 at or near its main surface 10. The pn-junctions 24 forming the photodiodes are arranged in or at the doped wells 4. If the semiconductor material of the substrate 1 has a basic doping for a second type of electric conductivity opposite to the first type, the doped wells 4 are provided with a higher doping concentration for the first type, resulting in a net doping for the first type of electric conductivity, and the pn-junctions 24 can thus be formed at the boundaries of the doped wells 4. The first type of electric conductivity may be n-type conductivity and the second type p-type conductivity or vice versa.

A wiring may be provided for the electric connection of the terminals of the photodiodes 2, 3 and terminals of an optional integrated circuit 25. A dielectric 5, which may be an oxide of the semiconductor material, especially silicon dioxide, for example, may be arranged on the main surface 10 to accommodate the wiring. In the figures the wiring is schematically represented by a wiring region 6, which may comprise a plurality of structured metal layers with vertical interconnects, the dielectric 5 forming an intermetal dielectric. The integrated circuit 25 allows the calculation to be performed directly on the device. External terminals may be provided by contact pads on the wiring, so that an electric signal can be delivered as a result of a measurement.

A passivation layer 7 may be provided as a cover, which is open above the contact pads. If the passivation layer 7 is silicon nitride, it is optionally removed from over the photodiodes 2, 3, since its high refractive index causes thin-film effects resulting in strong ripple on the photodiode spectral response curve. Also silicon nitride absorbs ultraviolet radiation with a spectral transmission curve dependent on type and thickness. In the embodiment shown in FIG. 1, the passivation layer 7 is provided with an opening forming a window 17 above the photodiodes 2, 3.

Further embodiments of the ultraviolet sensor device are described in the following. The device structure can be adapted to take account of the fact that the absorption length of light in semiconductor material, particularly in silicon, depends on the wavelength. Ultraviolet light has wavelengths in the range from 200 nm to 400 nm and is absorbed close to the surface of the semiconductor body, typically at a distance of less than 0.1 µm from the surface of incidence. Contrary to that, infrared light having wavelengths of more than 700 nm is primarily absorbed in regions deep within the semiconductor body.

Figure 2:
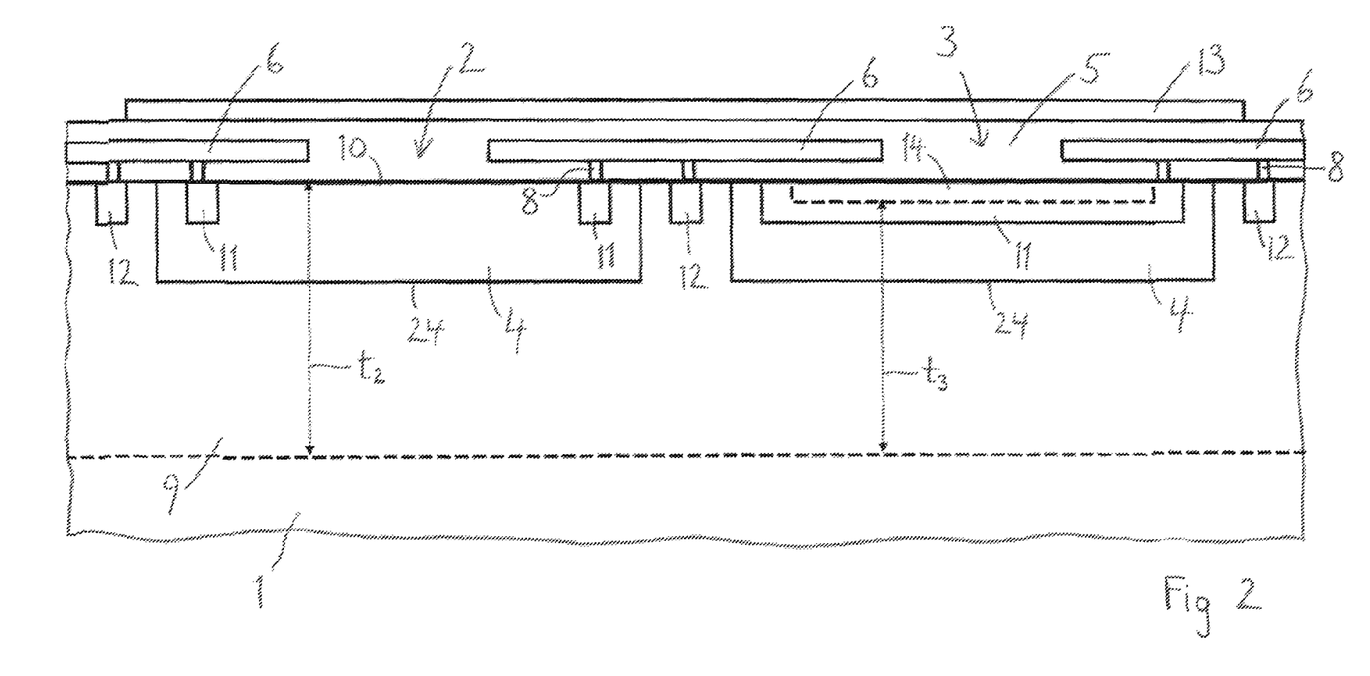
FIG. 2 is a cross section according to FIG. 1 for an embodiment comprising photodiodes of different structures.

FIG. 2 is a cross section of an embodiment comprising a substrate 1 that is formed with an epitaxial layer 9. The elements of the embodiment according to FIG. 2 that correspond to similar elements of the embodiment according to FIG. 1 are designated with the same reference numerals. The epitaxial layer 9 may be provided with a doping for the type of conductivity that is opposite to the type of conductivity of the doped wells 4, so that the pn-junctions are formed at the boundaries of the doped wells 4. The substrate 1 may comprise a p$^+$-doped silicon body, for instance, with a p-doped epitaxial layer 9 having n-doped wells 4 implanted therein. The epitaxial layer 9 defines the effective thickness $t_2$ of the channel-A-photodiode 2. Essentially all the charge carriers generated by the incident light in the absorption region between the main surface 10 and the lower boundary of the epitaxial layer 9 are collected by the pn-junction 24, even for zero voltage bias on the terminals of the channel-A-photodiode 2.

First-type contact regions 11 doped for the first type of conductivity may be provided in the doped wells 4 for external electric contacts, as indicated in FIG. 1 by vertical connections 8. The first-type contact regions 11 may have a sufficiently elevated doping concentration to allow the formation of low-ohmic metal contacts on the semiconductor material. Second-type contact regions 12 doped for the second type of conductivity may be provided in the epitaxial layer 9. The second-type contact regions 12 may also have an elevated doping concentration that is sufficient for low-ohmic metal/semiconductor contacts.

In the channel-B-photodiode 3 of the embodiment according to FIG. 2, the first-type contact region 11 extends over most of the area occupied by the doped well 4 and has a doping concentration that increases towards the main surface 10. The high doping concentration near the main surface 10 results in very short diffusion lengths of the charge carriers, thus forming a surface dead layer 14, which prevents any charge carriers generated in this layer from being collected by the pn-junction. The effective thickness $t_3$ of the channel-B-photodiode 3 is given by the distance between the lower boundary of the surface dead layer 14 and the lower boundary of the epitaxial layer 9. Thus the absorption region of the channel-B-photodiode 3 is located at a distance from the main surface 10, and compared with the channel-A-photodiode 2, the response to incident ultraviolet radiation is consequently inhibited or at least reduced in the channel-B-photodiode 3.

An additional improvement in the accuracy of the measurement of ultraviolet radiation can be obtained by arranging a common filter layer 13 as a low-pass filter above both photodiodes 2, 3. The material and shape of the common filter layer 13, in particular its thickness, are adapted for the purpose of transmitting ultraviolet radiation while blocking or at least attenuating visible and infrared light. The cutoff wavelength limiting the range that is filtered by the common filter layer 13 can be adapted to the requirements of a specific application.

Figure 3:
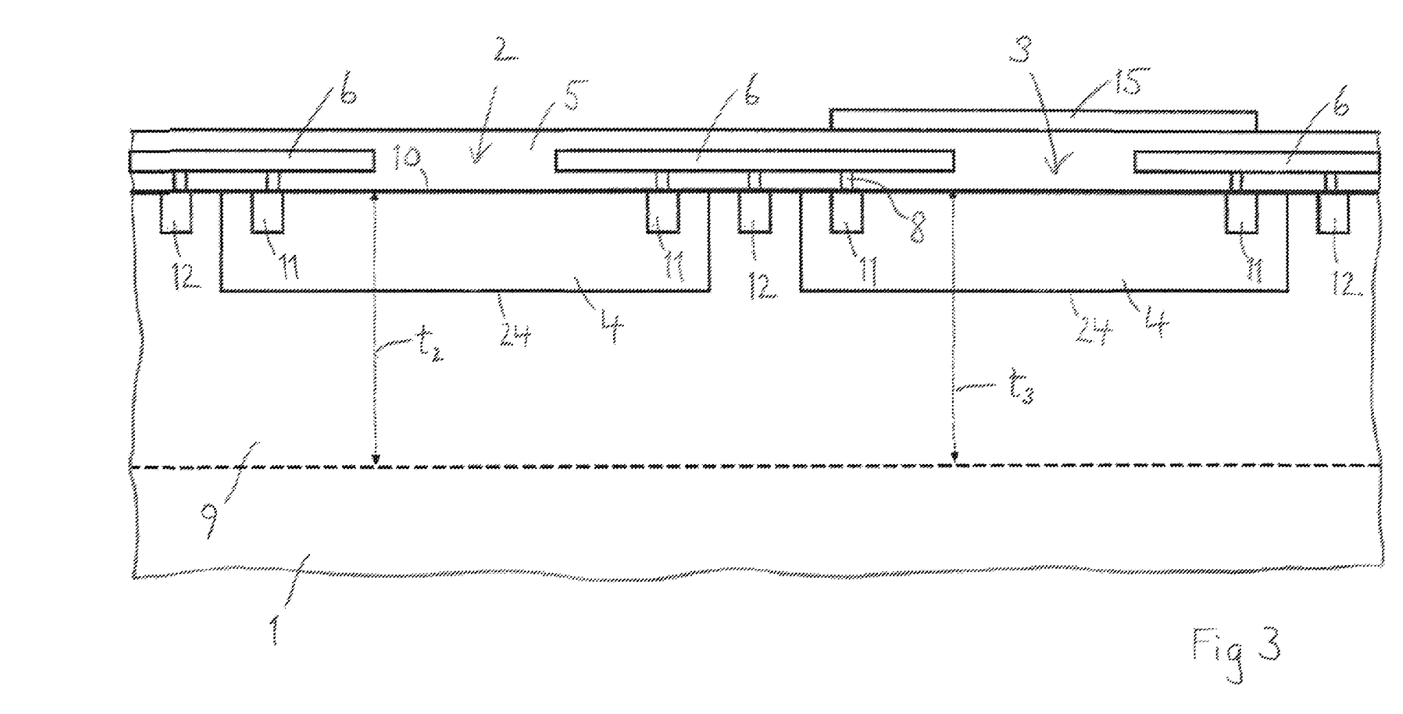
FIG. 3 is a cross section according to FIG. 1 for an embodiment comprising photodiodes of the same structure.

FIG. 3 is a cross section of a further embodiment comprising a substrate 1 that is formed with an epitaxial layer 9. The elements of the embodiment according to FIG. 3 that correspond to similar elements of the embodiment according to FIG. 2 are designated with the same reference numerals. In the embodiment according to FIG. 3, the channel-A-photodiode 2 and the channel-B-photodiode 3 may have the same structure and may be identical in their physical properties. The response of the channel-B-photodiode 3 to ultraviolet radiation is attenuated by a high-pass filter, which will be referred to as channel-B-filter layer 15 in the following. The channel-B-filter layer 15 is arranged above the channel-B-photodiode 3 but not above the channel-A-photodiode 2, in order to block or attenuate the transmission of incident ultraviolet radiation to the channel-B-photodiode 3 while transmitting all or at least most of the visible and infrared light. As the channel-B-filter layer 15 does not cover the channel-A-photodiode 2, the incident ultraviolet radiation is not blocked from the channel-A-photodiode 2.

When the embodiment according to FIG. 3 is used for a measurement of ultraviolet radiation, a modified difference $\Delta_m = ch_A - K \cdot ch_B$ may render a result that is more accurate than a simple difference. For an exemplary channel-B-filter layer 15, the typical value of $K=0.92^{-1}$ may be chosen, for example. The calculation may be performed by an integrated circuit, for example, or by means of an external device receiving the signals from the photodiodes. The channel-B-filter layer 15 may especially be formed from silicon nitride. A thin film of silicon nitride may already suffice to obtain the desired effect. A channel-B-filter layer 15 formed from silicon nitride may especially be thinner than a metal layer of a wiring. In the embodiment according to FIG. 3, an additional improvement in the accuracy of the measurement of ultraviolet radiation can be obtained by incorporating a low-pass filter above both photodiodes 2, 3 as shown in FIG. 4.

Figure 4:
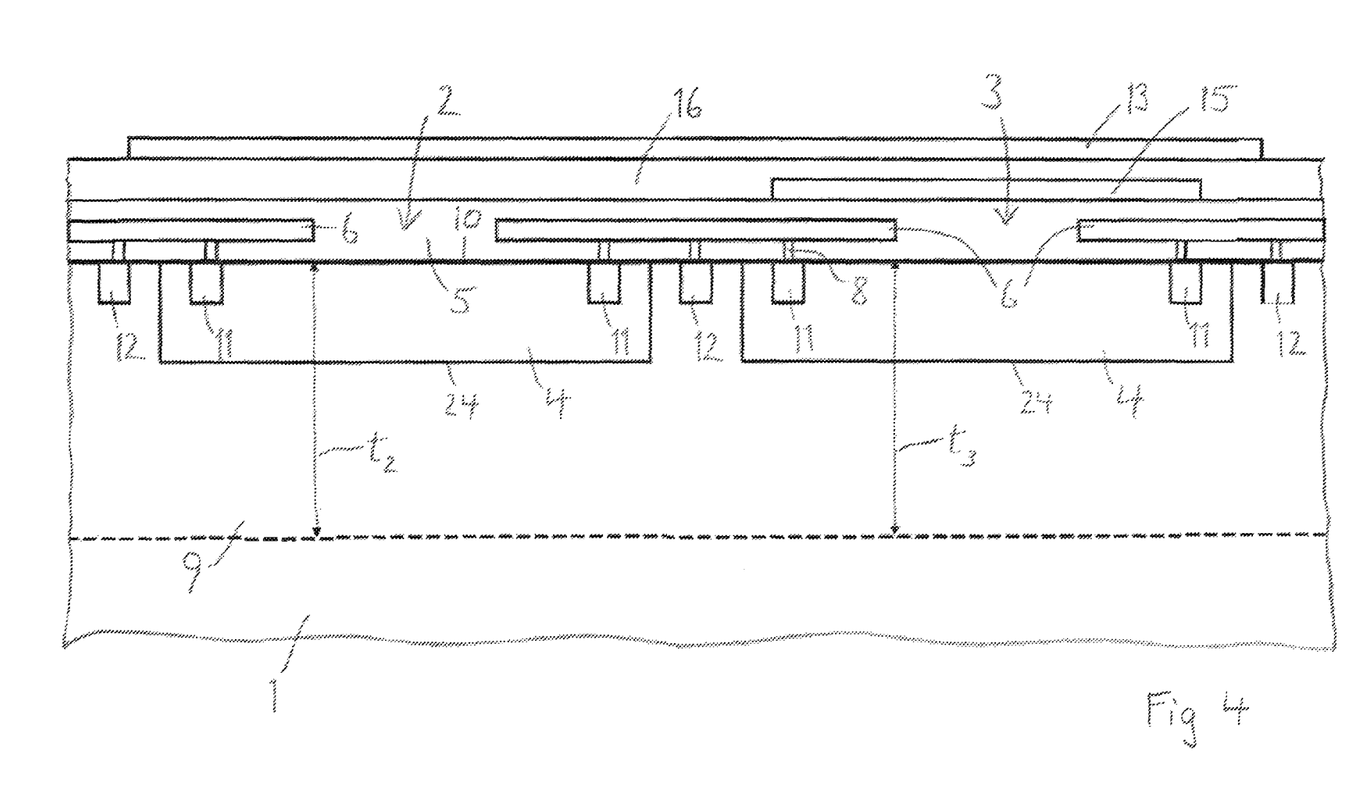
FIG. 4 is a cross section according to FIG. 3 for an embodiment with a further filter layer.

FIG. 4 is a cross section of a further embodiment according to FIG. 3 additionally comprising a common filter layer 13 arranged above both photodiodes 2, 3. The elements of the embodiment according to FIG. 4 that correspond to similar elements of the embodiment according to FIG. 3 are designated with the same reference numerals. The function of the common filter layer 13 as a low-pass filter was described above in conjunction with the embodiment according to FIG. 2. In the embodiment according to FIG. 4, the common filter layer 13 is arranged on a cover layer 16, which may be the same dielectric material as the dielectric 5 comprising the wiring, for example. Although the cover layer 16 is optional, it is appropriate if the common filter layer 13 is to be separated from the channel-B-filter layer 15.

Figure 5:
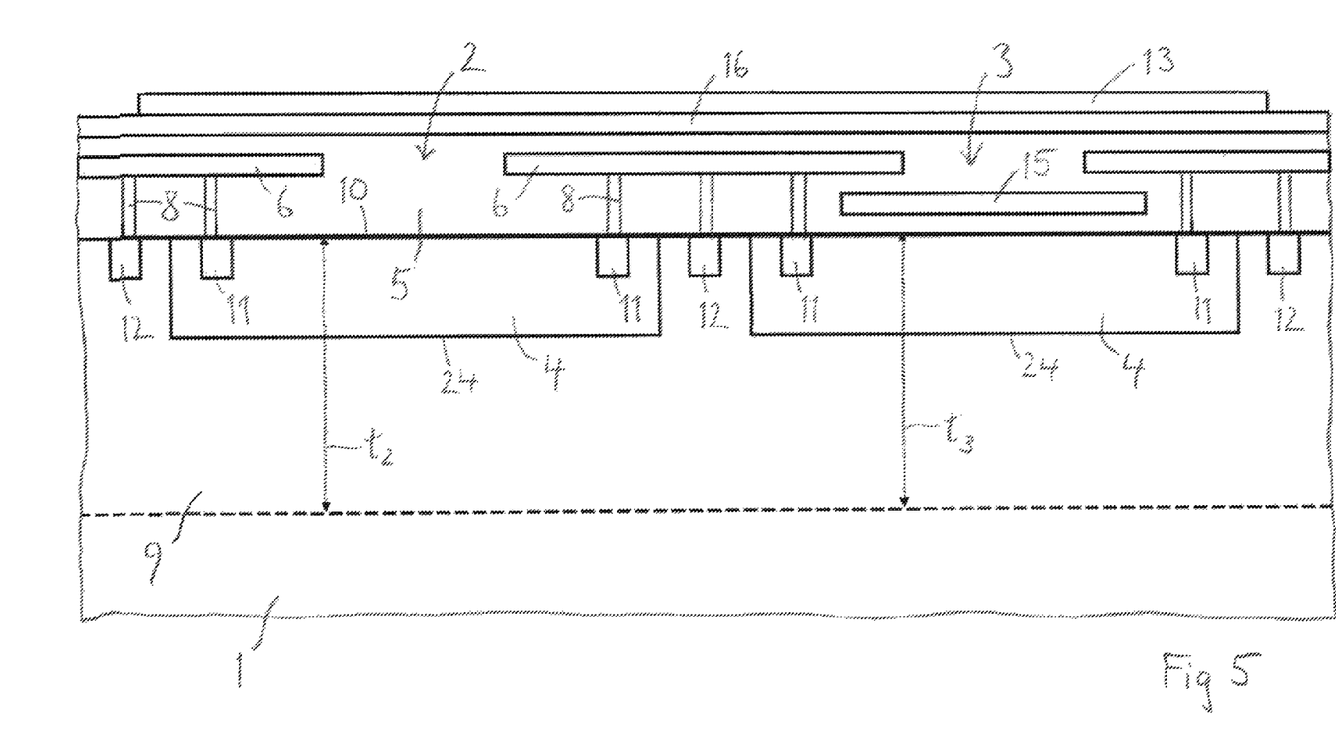
FIG. 5 is a cross section according to FIG. 4 for an embodiment with a different filter structure.

FIG. 5 is a cross section of a further embodiment according to FIG. 4 with the channel-B-filter layer 15 arranged within the dielectric 5 at the same level with metal layers of the wiring or even below the level of the wiring region 6. The elements of the embodiment according to FIG. 5 that correspond to similar elements of the embodiment according to FIG. 4 are designated with the same reference numerals. In the embodiment according to FIG. 5, the channel-B-filter layer 15 may be formed from polysilicon. A thin layer of polysilicon blocks ultraviolet radiation and can therefore be applied as a high-pass filter. If the channel-B-filter layer 15 is polysilicon, it may be typically about 0.2 μm thick, for instance. The common filter layer 13 shown in FIG. 5 is optional and can be omitted as in the embodiment according to FIG. 3.

The embodiments according to FIGS. 2 to 5 comprise pn-junctions 24 that are formed at the boundary of the doped wells 4. An epitaxial layer 9 is favorable in these embodiments, because it allows to adapt the doping concentration of the adjacent semiconductor material to the requirement of the pn-junctions 24 irrespective of a basic doping of the substrate 1, which is thus not relevant to the photodiodes and may be particularly adequate for further integrated components not shown in the figures. The embodiments according to FIGS. 6 to 11 comprise pn-junctions 24 that are formed within the doped wells 4, and an epitaxial layer 9 is less favorable in these embodiment and may hence be omitted.

Figure 6:
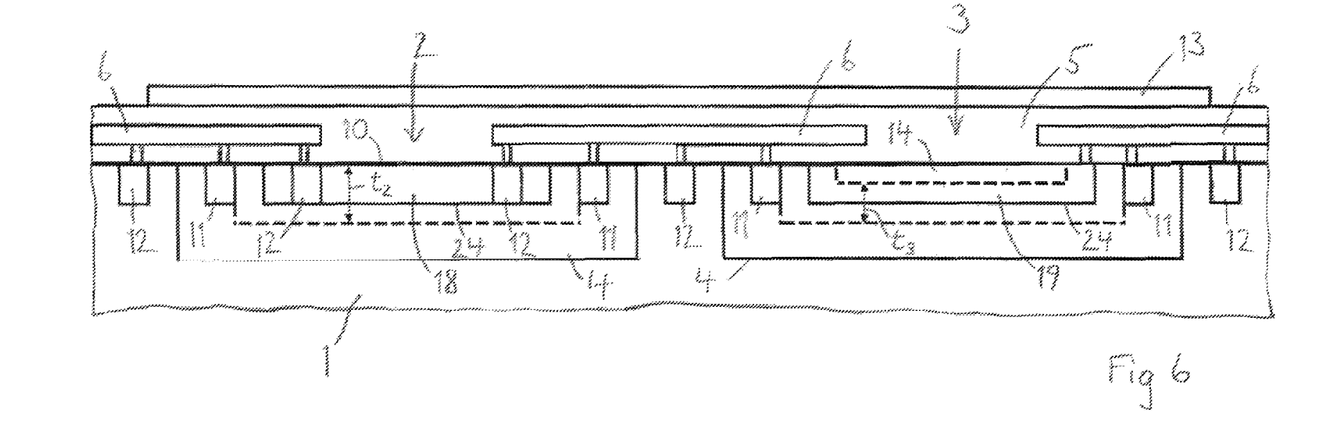
FIG. 6 is a cross section according to FIG. 2 for a further embodiment comprising photodiodes of different structures.

FIG. 6 is a cross section of a further embodiment according to FIG. 2 comprising a surface dead layer 14. The elements of the embodiment according to FIG. 6 that correspond to similar elements of the embodiment according to FIG. 2 are designated with the same reference numerals. The pn-junctions 24 are formed at the boundary of a doped channel-A-region 18 of the channel-A-photodiode 2 and at the boundary of a doped channel-B-region 19 of the channel-B-photodiode 3, respectively. The channel-A-region 18 and the channel-B-region 19 are doped for the opposite second type of electric conductivity. The channel-A-region 18 may be provided with a second-type contact region 12 for external electric connection. The effective thickness $t_2$ of the channel-A-photodiode 2 is approximately the distance from the main surface 10 to the depth indicated by a broken line below the channel-A-region 18.

In the embodiment according to FIG. 6, the channel-B-region 19 of the channel-B-photodiode 3 extends over most of the area occupied by the doped well 4 and has a doping concentration that increases towards the main surface 10. The high doping concentration near the main surface 10 results in very short diffusion lengths of the charge carriers, thus forming a surface dead layer 14, which prevents any charge carriers generated in this layer from being collected by the pn-junction. The occurrence of a surface dead layer 14 in the channel-A-photodiode 2 is prevented by a sufficiently low doping concentration of the channel-A-region 18 in the vicinity of the main surface 10. The effective thickness $t_3$ of the channel-B-photodiode 3 is approximately the distance from the lower boundary of the surface dead layer 14, which is indicated in FIG. 6 by a broken line within the channel-B-region 19, to the depth indicated by a further broken line below the channel-B-region 19.

The depth of the surface dead layer 14 measured from the main surface 10 may be typically about 0.1 µm, for example, and the depth of the absorption region indicated by the further broken line below, also measured from the main surface 10, may be typically about 0.5 µm, for example. Thus the absorption region of the channel-B-photodiode 3 is located at a distance from the main surface 10, and compared with the channel-A-photodiode 2, the response to incident ultraviolet radiation is consequently inhibited or at least reduced in the channel-B-photodiode 3, in a manner that is similar to the embodiment according to FIG. 2. The common filter layer 13 shown in FIG. 6 may be provided as a low-pass filter, but it is optional and can be omitted.

Figure 7:
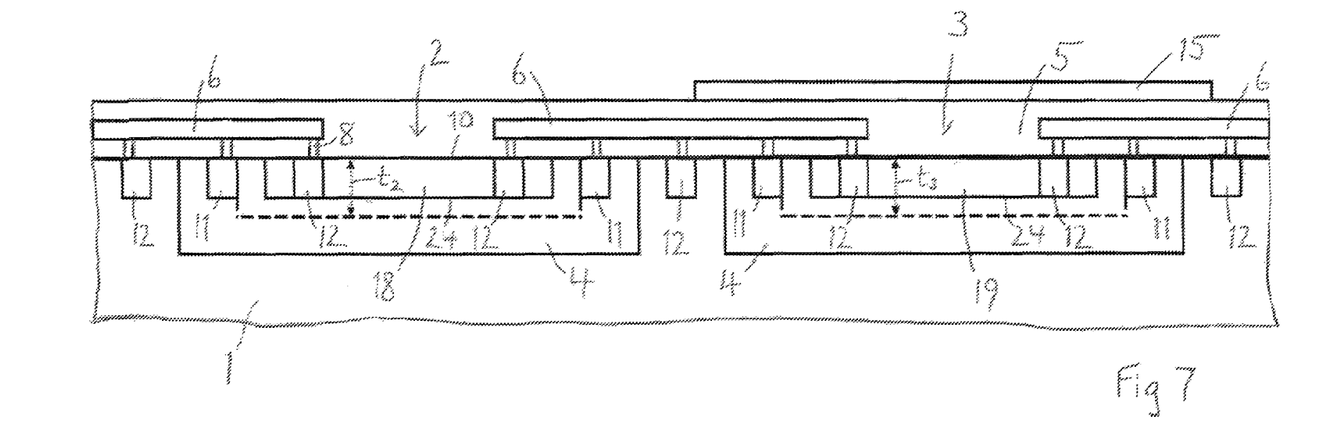
FIG. 7 is a cross section according to FIG. 3 for a further embodiment comprising photodiodes of the same structure.

FIG. 7 is a cross section of a further embodiment according to FIG. 3 comprising a channel-B-filter layer 15 provided as a high-pass filter only above the channel-B-photodiode 3. The pn-junctions 24 are formed within the doped wells 4 at the boundary of a doped channel-A-region 18 of the channel-A-photodiode 2 and at the boundary of a doped channel-B-region 19 of the channel-B-photodiode 3, respectively, as in the embodiment according to FIG. 6. The elements of the embodiment according to FIG. 7 that correspond to similar elements of the embodiment according to FIG. 6 are designated with the same reference numerals. In the embodiment according to FIG. 7, the channel-A-photodiode 2 and the channel-B-photodiode 3 may have the same structure and may be identical in their physical properties. The effective thickness $t_2$ of the channel-A-photodiode 2 may therefore be the same as the effective thickness $t_3$ of the channel-B-photodiode 3. Similar second-type contact regions 12 may be provided for the channel-A-photodiode 2 within the channel-A-region 18 and for the channel-B-photodiode 3 within the channel-B-region 19.

The above description in conjunction with the embodiment according to FIG. 3 also applies to the embodiment according to FIG. 7 with respect to the channel-B-filter layer 15, which may especially be formed from silicon nitride. The calculation of a modified difference $\Delta_m = ch_A - K \cdot ch_B$ may be suitable to obtain the most accurate result of a measurement of ultraviolet radiation, and the value $K=0.92^{-1}$, for example, may typically be appropriate for the correcting factor K for embodiments having an exemplary channel-B-filter layer 15. The calculation may be performed by an integrated circuit, for example, or by means of an external device receiving the signals from the photodiodes.

Figure 8:
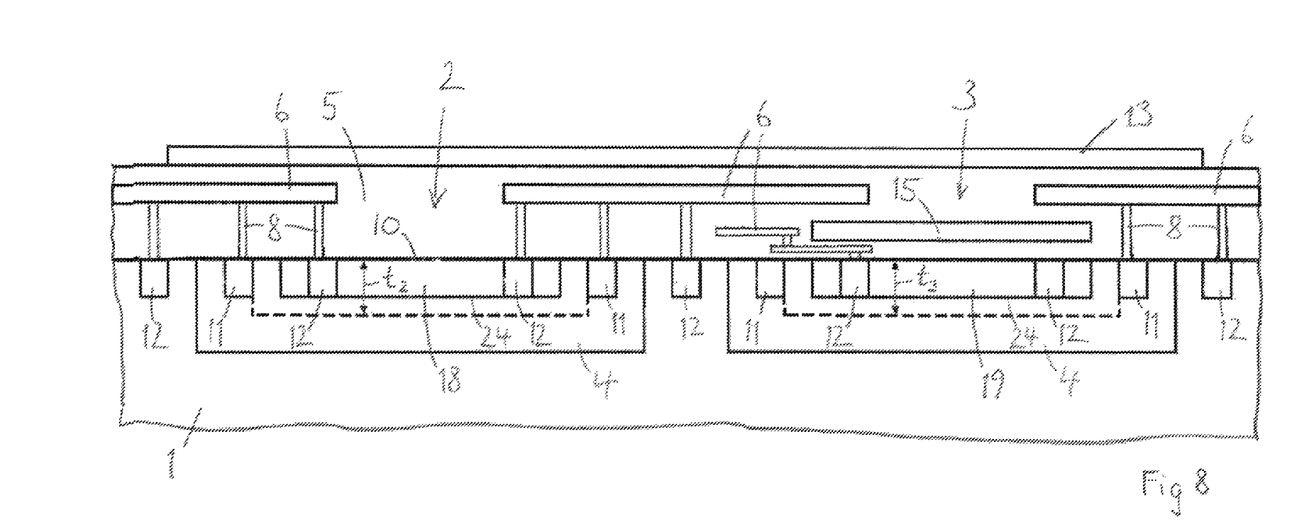
FIG. 8 is a cross section according to FIG. 7 for an embodiment with a different filter structure.

FIG. 8 is a cross section of a further embodiment according to FIG. 7 with the channel-B-filter layer 15 arranged within the dielectric 5 at the same level with metal layers of the wiring or even below the level of the wiring region 6. The elements of the embodiment according to FIG. 8 that correspond to similar elements of the embodiment according to FIG. 7 are designated with the same reference numerals. In the embodiment according to FIG. 8, the channel-B-filter layer 15 may be formed from polysilicon functioning as a high-pass filter, which may have a typical thickness of about 0.2 µm, for instance. A common filter layer 13 as shown in FIG. 8 may be provided as a low-pass filter, but it is optional and can be omitted as in the embodiment according to FIG. 7.

Figure 9:
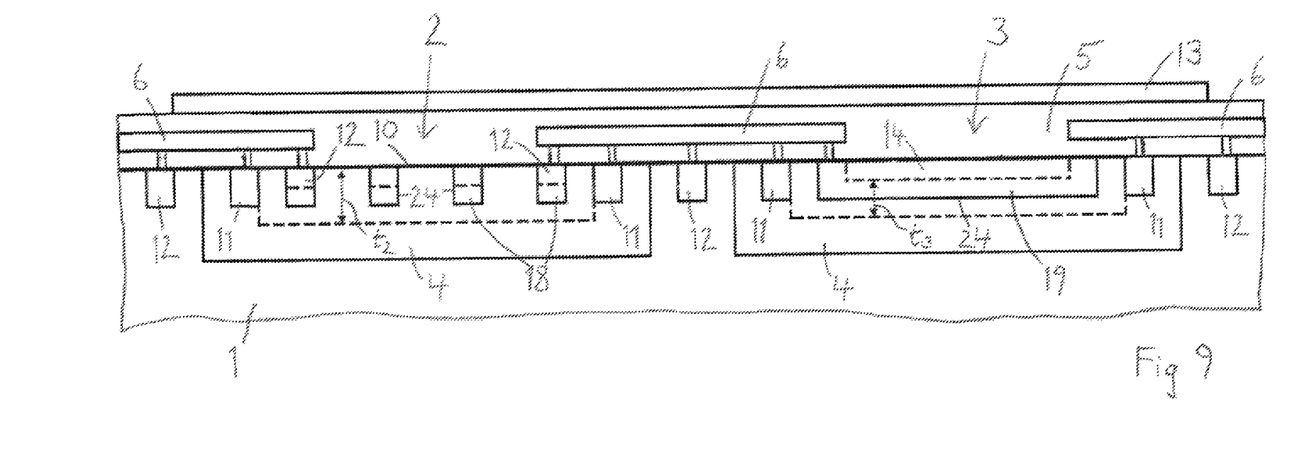
FIG. 9 is a cross section according to FIG. 6 for a further embodiment comprising photodiodes of different structures.

FIG. 9 is a cross section according to FIG. 6 for a further embodiment comprising a surface dead layer 14. The elements of the embodiment according to FIG. 9 that correspond to similar elements of the embodiment according to FIG. 6 are designated with the same reference numerals. The difference between the embodiments according to FIGS. 6 and 9 is the structure of the channel-A-photodiode 2, which has a doped channel-A-region 18 comprising small closely spaced stripes or islands in the embodiment according to FIG. 9. The channel-A-region 18 may have a doping concentration that increases towards the main surface 10, in order to form second-type contact regions 12.

An interconnect pattern that may be provided in a metal layer for an external electric connection of the channel-A-photodiode 2 is optionally structured to cover the stripes or islands of the channel-A-region 18, so that only the intermediate areas are exposed to the incident radiation. In this case a similar interconnect pattern may be provided for the channel-B-photodiode 3 in order to have identical areas of both photodiodes 2, 3 exposed to the incident radiation and to facilitate the elimination of a signal portion that is due to non-ultraviolet radiation by simple subtraction. A common filter layer 13 as shown in FIG. 9 may be provided as a low-pass filter, but it is optional and can be omitted as in the embodiment according to FIG. 7.

Figure 10:
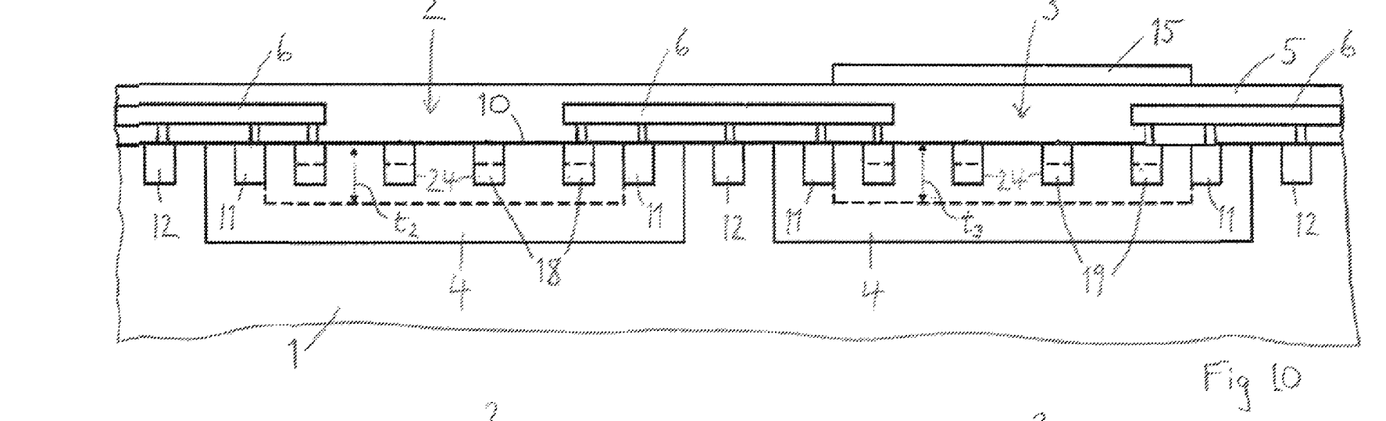
FIG. 10 is a cross section according to FIG. 9 for a further embodiment comprising photodiodes of the same structure.

FIG. 10 is a cross section according to FIG. 9 for a further embodiment comprising a channel-B-filter layer 15. The elements of the embodiment according to FIG. 10 that correspond to similar elements of the embodiment according to FIG. 9 are designated with the same reference numerals. In the embodiment according to FIG. 10, the channel-A-photodiode 2 and the channel-B-photodiode 3 may have the same structure. In particular the doped channel-A-region 18 and the doped channel-B-region 19 may comprise the same pattern of stripes or islands as shown in FIG. 10. The effective thickness $t_2$ of the channel-A-photodiode 2 is the same as the effective thickness $t_3$ of the channel-B-photodiode 3. The response of the channel-B-photodiode 3 to incident ultraviolet radiation is attenuated by the channel-B-filter layer 15 functioning as a high-pass filter. The channel-B-filter layer 15 is arranged above the channel-B-photodiode 3 but not above the channel-A-photodiode 2 as in the embodiments according to FIGS. 3, 4 and 7. In the embodiment according to FIG. 10, an additional improvement in the accuracy of the measurement of ultraviolet radiation can be obtained by incorporating a low-pass filter as a common filter layer 13 above both photodiodes 2, 3 as described above.

Figure 11:
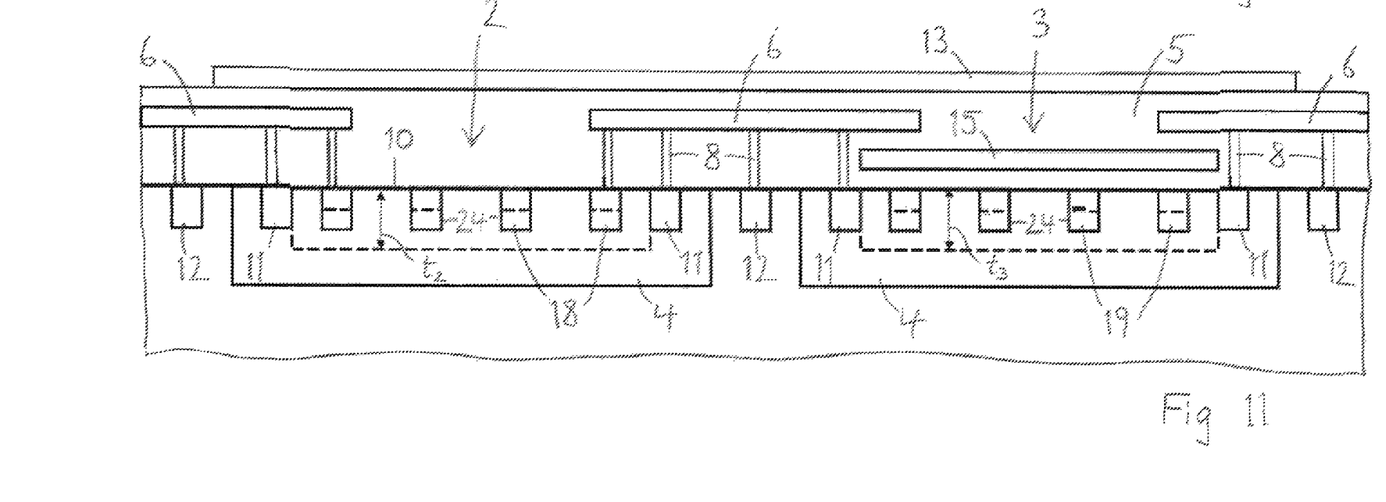
FIG. 11 is a cross section according to FIG. 10 for an embodiment with a different filter structure.

FIG. 11 is a cross section of a further embodiment according to FIG. 10 with the channel-B-filter layer 15 arranged within the dielectric 5 at the same level with metal layers of the wiring or even below the level of the wiring region 6. The elements of the embodiment according to FIG. 11 that correspond to similar elements of the embodiment according to FIG. 10 are designated with the same reference numerals. In the embodiment according to FIG. 11, the channel-B-filter layer 15 may be formed from polysilicon functioning as a high-pass filter, which may have a typical thickness of about 0.2 μm, for instance. A common filter layer 13 as shown in FIG. 11 may be provided as a low-pass filter, but it is optional and can be omitted as in the embodiment according to FIG. 10.

Figure 12:
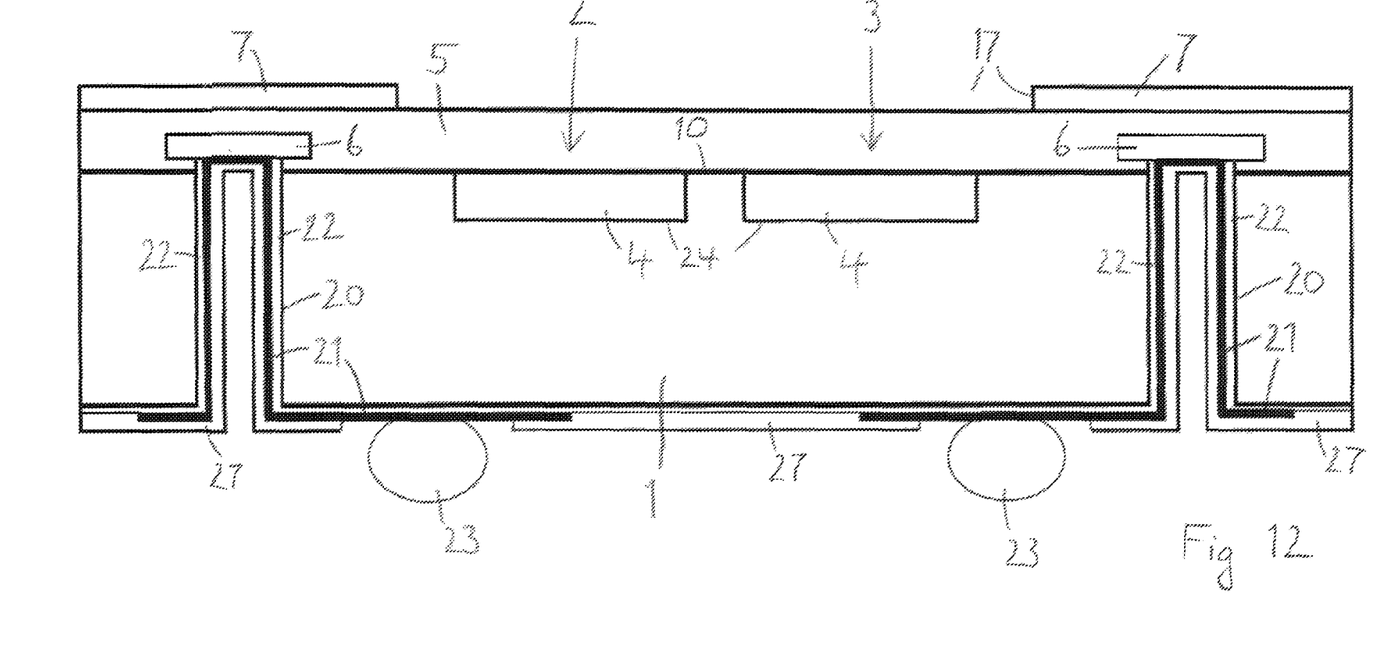
FIG. 12 is a cross section of a further embodiment comprising through-substrate vias.

FIG. 12 is a schematic cross section according to FIG. 1 for a further embodiment comprising through-substrate vias. The elements of the embodiment according to FIG. 12 that correspond to similar elements of the embodiment according to FIG. 1 are designated with the same reference numerals. The embodiment according to FIG. 12 comprises through-substrate vias 20, which can be formed by etching via holes in the substrate 1. A metallization 21, which may be insulated from the substrate 1 by a rear dielectric 22, is provided for an electric connection between the wiring and the rear side of the device opposite the main surface 10. The metallization 21 contacts a contact area that is provided on the wiring within the wiring region 6. The metallization 21 thus connects electric terminals of the photodiodes 2, 3 and, optionally, of an integrated circuit with contact pads on the rear side. Contact bumps 23 may be provided on the rear contact pads for an external electric connection to a carrier like a printed circuit board, for instance, or the like.

The through-substrate vias 20 can be produced by etching via holes into the semiconductor material of the substrate 1, which can be performed from the rear side, after the main surface 1 has been provided with components of an integrated circuit like a CMOS circuit, for instance. The rear dielectric 22 may then be deposited on the sidewalls of the via holes and on the rear surface of the substrate 1 for electric isolation. The metallization 21 is deposited as a metal layer on the sidewalls within the via holes and on the back side of the surface 1 and may especially be provided as a redistribution layer, which is structured according to this purpose.

A rear passivation layer 27, which may be silicon nitride, for instance, may be deposited as a moisture barrier and a mechanical protection. Contact pads of the metallization are opened in the rear passivation layer 27 and are provided with the contact bumps 23, which may be metal or solder balls, for instance.

The embodiments described above can be integrated on the same silicon die or wafer together with interface circuits, processors, and other types of optical sensors such as color sensors, ambient-light sensors, and infrared sensors. The described low-pass and high-pass filters can be conventional interference filters consisting of multi-layers of different dielectric materials, for example. Other types of junctions, filters, and coatings or passivations can also be used. In each embodiment the calculation of the difference signal may be performed by an integrated circuit or using an external device, which receives the two signals from the photodiodes.

The use of through-substrate vias enables the sensor device to be directly exposed to incident ultraviolet light without any absorbing intermediate material, because the external electric connections can be arranged entirely on the back surface of the device, and thus any device structures that could unduly shield the incident light can be kept out of the areas that are provided for light incidence. Through-substrate vias can be used in conjunction with all described embodiments of the differential dual photodiode ultraviolet sensor. The use of through-substrate vias enables small packages and low-cost production of ultraviolet sensors.

The invention claimed is:

1. A semiconductor sensor device, comprising:
a semiconductor substrate having a main surface;
a photodiode arranged in the substrate at the main surface, the photodiode generating an electric signal in response to incident radiation;
a further photodiode arranged in the substrate at the main surface, the further photodiode generating a further electric signal in response to the incident radiation;
the photodiode and the further photodiode being formed and arranged in such a manner that in case of incident ultraviolet radiation the electric signal from the photodiode is larger than the further electric signal from the further photodiode;
the electric signal from the photodiode being attenuated by the further electric signal and thus yielding an electric signal primarily measuring the incident ultraviolet radiation;
a doped region of the photodiode, the doped region comprising spaced stripes or islands and a boundary; and
pn-junctions of the photodiode being formed at the boundary of the doped region.

2. The semiconductor sensor device of claim 1, wherein the attenuation comprises a subtraction of the further electric signal generated by the further photodiode from the electric signal generated by the photodiode.

3. The semiconductor sensor device of claim 1, further comprising:
an integrated circuit in the substrate, the integrated circuit being provided to attenuate the electric signal generated by the photodiode by the further electric signal generated by the further photodiode.

4. The semiconductor sensor device of claim 1, further comprising:
a filter layer that reduces or inhibits a transmission of the incident ultraviolet radiation to the further photodiode without reducing or inhibiting a transmission of the incident ultraviolet radiation to the photodiode.

5. The semiconductor sensor device of claim 4, wherein the filter layer is formed from silicon nitride.

6. The semiconductor sensor device of claim 4, wherein the filter layer is formed from polysilicon.

7. The semiconductor sensor device of claim 1, further comprising:
doped wells of a first type of electric conductivity formed in the substrate at the main surface; and
pn-junctions arranged in or at the doped wells, the pn-junctions forming the photodiode and the further photodiode.

8. The semiconductor sensor device of claim 7, wherein the substrate is doped for a second type of electric conductivity opposite to the first type of electric conductivity, a net doping of the first type of electric conductivity being present in the doped wells and forming the pn-junctions.

9. The semiconductor sensor device of claim 7, wherein the substrate is provided with an epitaxial layer doped for a second type of electric conductivity opposite to the first type of electric conductivity, the epitaxial layer forming the main surface, and wherein the doped wells are arranged within the epitaxial layer, a net doping of the first type of electric conductivity being present in the doped wells and forming the pn-junctions.

10. The semiconductor sensor device of claim 7, further comprising:

doped regions of a second type of electric conductivity opposite to the first type of electric conductivity arranged within the doped wells, the pn-junctions being formed at a boundary between the doped wells and the doped regions.

11. The semiconductor sensor device of claim 10, wherein the doped region of the further photodiode comprises a doping concentration that increases towards the main surface, thus forming a surface dead layer of reduced diffusion lengths of charge carriers.

12. The semiconductor sensor device of claim 1, further comprising:

a further doped region of the further photodiode, the further doped region comprising spaced stripes or islands and a boundary; and pn-junctions of the further photodiode being formed at the boundary of the further doped region.

13. A semiconductor sensor device, comprising:

a semiconductor substrate having a main surface;

a photodiode arranged in the substrate at the main surface, the photodiode generating an electric signal in response to incident radiation;

a further photodiode arranged in the substrate at the main surface, the further photodiode generating a further electric signal in response to the incident radiation;

the photodiode and the further photodiode being formed and arranged in such a manner that in case of incident ultraviolet radiation the electric signal from the photodiode is larger than the further electric signal from the further photodiode;

the electric signal from the photodiode being attenuated by the further electric signal and thus yielding an electric signal primarily measuring the incident ultraviolet radiation;

doped wells of a first type of electric conductivity formed in the substrate at the main surface;

pn-junctions arranged in or at the doped wells, the pn-junctions forming the photodiode and the further photodiode;

a contact region being arranged in the doped well of the further photodiode, the contact region being doped for the first type of conductivity with a doping concentration that increases towards the main surface, the contact region extending over most of the area occupied by the doped well;

a doped region of the photodiode, the doped region comprising spaced stripes or islands and a boundary; and pn-junctions of the photodiode being formed at the boundary of the doped region.

14. The semiconductor sensor device of claim 13, further comprising:

a further doped region of the further photodiode, the further doped region comprising spaced stripes or islands and a boundary; and pn-junctions of the further photodiode being formed at the boundary of the further doped region.

15. A semiconductor sensor device, comprising:

a semiconductor substrate having a main surface;

a photodiode arranged in the substrate at the main surface, the photodiode generating an electric signal in response to incident radiation;

a further photodiode arranged in the substrate at the main surface, the further photodiode generating a further electric signal in response to the incident radiation;

the photodiode and the further photodiode being formed and arranged in such a manner that in case of incident ultraviolet radiation the electric signal from the photodiode is larger than the further electric signal from the further photodiode;

the electric signal from the photodiode being attenuated by the further electric signal and thus yielding an electric signal primarily measuring the incident ultraviolet radiation;

doped wells of a first type of electric conductivity formed in the substrate at the main surface;

pn-junctions arranged in or at the doped wells, the pn-junctions forming the photodiode and the further photodiode;

a channel-B-region being arranged in the doped well of the further photodiode, the channel-B-region being doped for a second type of conductivity with a doping concentration that increases towards the main surface, the channel-B-region extending over most of the area occupied by the doped well or comprising a pattern of stripes or islands;

a doped region of the photodiode, the doped region comprising spaced stripes or islands and a boundary; and pn-junctions of the photodiode being formed at the boundary of the doped region.

16. The semiconductor sensor device of claim 15, further comprising:

a further doped region of the further photodiode, the further doped region comprising spaced stripes or islands and a boundary; and pn-junctions of the further photodiode being formed at the boundary of the further doped region.

* * * * *